United States Patent
Lei et al.

(10) Patent No.: US 7,011,929 B2
(45) Date of Patent: Mar. 14, 2006

(54) METHOD FOR FORMING MULTIPLE SPACER WIDTHS

(75) Inventors: Ming-Ta Lei, Hsin-Chu (TW);
Yih-Shung Lin, Sanchung (TW);
Ai-Sen Liu, Hsin-Chu (TW);
Cheng-Chung Lin, Taipei (TW);
Baw-Ching Perng, Hsin-Chu (TW);
Chia-Hui Lin, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 156 days.

(21) Appl. No.: 10/340,245

(22) Filed: Jan. 9, 2003

(65) Prior Publication Data

US 2004/0137373 A1    Jul. 15, 2004

(51) Int. Cl.
*H01L 21/302* (2006.01)
(52) U.S. Cl. ............. 430/311; 430/313; 430/317; 430/394; 438/738; 438/737
(58) Field of Classification Search ........... 430/313, 430/311, 317, 394; 438/738, 737
See application file for complete search history.

(56) References Cited

U.S. PATENT DOCUMENTS 5,935,875 A * 8/1999 Lee ..................... 438/737

FOREIGN PATENT DOCUMENTS

TW            502375           9/2002

* cited by examiner

*Primary Examiner*—John A. McPherson
*Assistant Examiner*—Daborah Chacko-Davis
(74) *Attorney, Agent, or Firm*—Tung & Assoc.

(57) ABSTRACT

A method of forming pluralities of gate sidewall spacers each plurality comprising different associated gate sidewall spacer widths including providing a plurality of gate structures formed overlying a substrate and a plurality of dielectric layers formed substantially conformally overlying the gate structures; exposing a first selected portion of the plurality followed by anisotropically etching through a thickness portion comprising at least the uppermost dielectric layer to form a first sidewall spacer width; exposing a first subsequent selected portion of the plurality followed by etching through at least a thickness portion of the uppermost dielectric layer; and, exposing a second subsequent selected portion of the plurality followed by anisotropically etching through at least a thickness portion of the uppermost dielectric layer to form a subsequent sidewall spacer width.

20 Claims, 2 Drawing Sheets

METHOD FOR FORMING MULTIPLE SPACER WIDTHS

FIELD OF THE INVENTION

This invention generally relates to microelectronic integrated circuit (IC) semiconductor device fabrication and more particularly to a method for multiple spacer width formation in forming multiple transistor structures for a semiconductor device.

BACKGROUND OF THE INVENTION

With increasing demands for embedded memory type circuits, mixed-signal circuits, and system on chip (SOC) IC design, it has become necessary to form multiple transistor structures for a semiconductor device IC. For example, transistors with different structures and functions typically operate under different current and voltage parameters requiring different semiconductor doping widths and depths for the various transistors. For example, the width of the LDD region is typically controlled by the width of spacers formed adjacent to a semiconductor gate structure to act as a mask before or following one or more semiconductor substrate doping processes, for example ion implantation, to form regions of differing doping concentrations, for example source/drain (S/D) regions adjacent the LDD regions. The width of the sidewall spacer formed adjacent a gate structure is an important variable in defining the width of the doping regions and consequently defining the particular transistor design performance including threshold operating voltages and currents.

Although methods have been proposed in the prior art for forming multiple width sidewall spacers, the methods generally require an excessive number of photoresist patterning processes and etching processes and/or deposition processes as well as present the possibility of etching damage to the source and drain areas.

Thus, there is a need in the semiconductor device manufacturing art for an improved method for forming sidewall spacers of multiple widths while avoiding etching damage to the source and drain areas.

It is therefore an object of the invention to provide an improved method for forming sidewall spacers of multiple widths while avoiding etching damage to the source and drain areas in addition to overcoming other shortcomings and deficiencies of the prior art.

A principle object of the present invention is to provide a process that allows the formation of spacers with different widths.

Another object of the present invention is to provide a method that includes at least N spacer dielectric layers to produce N spacer widths.

SUMMARY OF THE INVENTION

To achieve the foregoing and other objects, and in accordance with the purposes of the present invention, as embodied and broadly described herein, the present invention provides a method of forming pluralities of gate sidewall spacers each plurality comprising different associated gate sidewall spacer widths.

These objects are achieved by using the process which includes providing a plurality of gate structures formed overlying a substrate and a plurality of dielectric layers formed substantially conformally overlying the gate structures; exposing a first selected portion of the plurality followed by anisotropically etching through a thickness portion comprising at least the uppermost dielectric layer to form a first sidewall spacer width; exposing a first subsequent selected portion of the plurality followed by etching through at least a thickness portion of the uppermost dielectric layer; and, exposing a second subsequent selected portion of the plurality followed by anisotropically etching through at least a thickness portion of the uppermost dielectric layer to form a subsequent second sidewall spacer width.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

While the method of the present invention is explained with reference for the formation of gate sidewall spacers it will be understood that the method of the present invention may be adapted for the formation of spacers in the formation of any semiconductor structure.

Figure 1A:
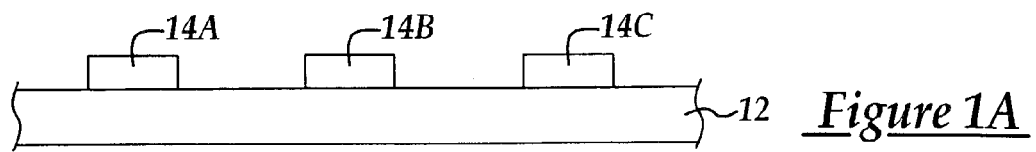
FIGS. 1A–1G are cross sectional side views of a portion of a semiconductor device at manufacturing stages according to an embodiment of the present invention.

Referring to FIG. 1A is shown a substrate 12, for example silicon or silicon on insulator (SOI). It will be appreciated that a thin layer of silicon oxide (e.g., $SiO_2$), for example a gate oxide (not shown), may be formed overlying the substrate 12. In addition, the upper layer of the substrate 12 may include other materials such as silicon nitride (e.g., SiN), and silicon oxynitride (e.g., SiON). Shown overlying substrate 12 are multiple gate structures e.g., 14A, 14B, and 14C. Although the details of the gate structure may vary, the gate structure typically includes one or more gate dielectric layers formed over the substrate 12, followed by a conductive gate material such as polysilicon, metal or SiGe, followed by a photolithographic patterning process to define the gate structure and a plasma etching process, for example a polysilicon dry etching process, to form multiple gate structures e.g., 14A, 14B, and 14C. It will be appreciated that the gate dielectric may include silicon oxide ($SiO_2$) or high-k dielectric gate dielectric structures formed of metal oxides such as tantalum oxides (e.g., $Ta_2O_5$), titanium oxides, (e.g., $TiO_2$), hafnium oxides (e.g., $HfO_2$), yttrium oxides (e.g., $Y_2O_3$), and lanthanum oxides (e.g., $La_2O_5$). In addition, a silicide such as a tungsten silicide or a cobalt silicide in a self aligned silicide (salicide) formation process may be formed over the top portion of the gate structures. The gate structures may include other materials as are known in the art for producing gate structures such as an overlying oxide or nitride liner. It will be appreciated that a plurality of gate structures e.g., 14A, 14B, 14C preferably are formed on a semiconductor process surface or on a die for forming a multiple transistor integrated circuit including having different gate structure dimensions, for example line widths or gate lengths.

Figure 1B:
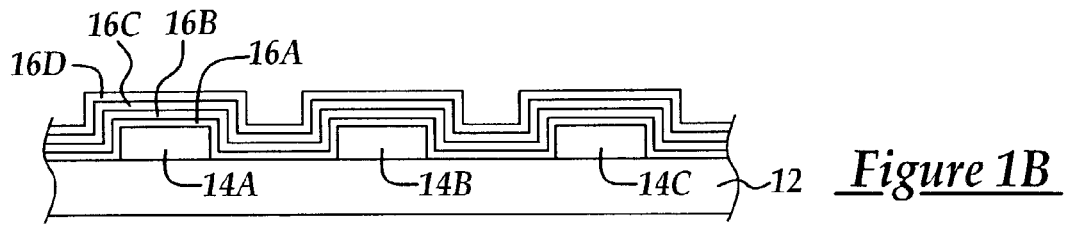

Referring to FIG. 1B, according to an embodiment of the present invention N+1 spacer dielectric layers are sequentially blanket deposited overlying the gate structures, e.g., 14A, 14B, and 14C, where N is the desired number of different sidewall spacer widths desired. In the illustrated embodiment, the number of different desired sidewall spacer widths is 3, so the number of overlying spacer dielectric layers deposited is 4 e.g., 16A, 16B, 16C, and 16D. Preferably, the spacer dielectric layers are deposited to a thickness between about 100 Angstroms and about 1500 Angstroms. It will be appreciated that the spacer dielectric layer thickness will depend in part on the desired sidewall spacer width. The spacer dielectric layers e.g., 16A, 16B, 16C, and 16D are preferably selected from the group consisting of oxides and nitrides, for example silicon oxide (e.g., $SiO_2$), carbon doped silicon oxide, silicon nitride (e.g., $Si_3N_4$), silicon oxynitride (e.g. SiON) and silicon oxycarbide (e.g., $SiO_xC_y$) where X+Y is about equal to 2. Preferably, the spacer dielectric layers e.g., 16A, 16B, 16C, and 16D are selected such that any two adjacent spacer dielectric layers have an etching rate difference of greater than about 5 with respect to a subsequent etching process, for example a subsequent isotropic wet etching process.

Figure 1C:
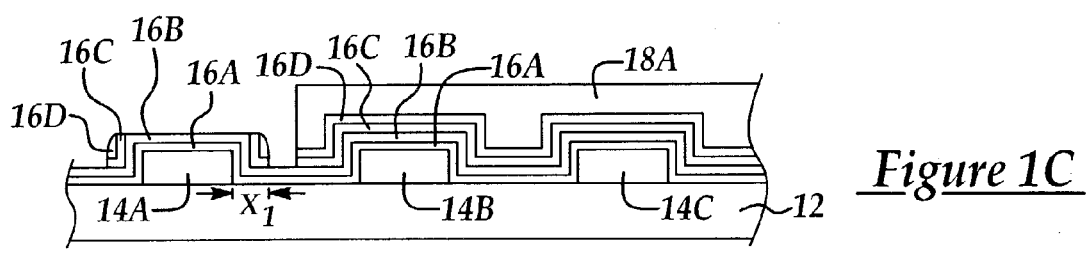

Referring to FIG. 1C, following formation of the multiple spacer dielectric layers e.g., 16A, 16B, 16C, and 16D, the gate structures are covered with a photoresist layer 18A which is then photolithographically patterned to expose a first selected plurality of the gate structures, e.g., 14A, while covering a remaining portion, e.g., 14B and 14C. Following exposing of the first selected portion, e.g., 14A, an anisotropic etching process, for example a dry etching process is carried out to anisotropically etch through a thickness of the two uppermost spacer dielectric layers e.g., 16D and 16C, to form a first sidewall spacer width e.g., X1. During the anisotropic etching process the third and fourth spacer dielectric layers, 16C and 16D are removed over the top portion of the gate structure while leaving a portion of layers 16C and 16D on the sidewall portions of the gate structure. The particular anisotropic etching process will depend on the material of the two uppermost spacer dielectric layers as will be appreciated by one skilled in the art, for example a nitride and oxide, respectively.

Figure 1D:
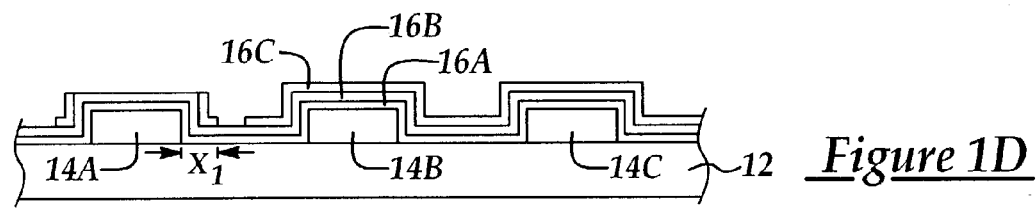

Referring to FIG. 1D, following formation of the first sidewall spacer width e.g., X1, the first protective photoresist layer 18A is removed and an isotropic etching process, for example a wet isotropic etching process is carried out to remove the fourth spacer dielectric layer, e.g., 16D. It will be appreciated that the spacer dielectric layer 16D remaining over the first sidewall spacer layer of the first selected portion, e.g., 14A is likewise removed. For example, the particular isotropic etch process will depend on materials making up the uppermost spacer dielectric layer e.g., 16D as will be appreciated by a skilled practitioner. For example, wet etching solutions including hot phosphoric acid ($H_3PO_4$) and dilute HF or buffered oxide etch (BOE) including ammonium fluoride, are commonly used for selectively etching nitrides and oxides, respectively.

Figure 1E:
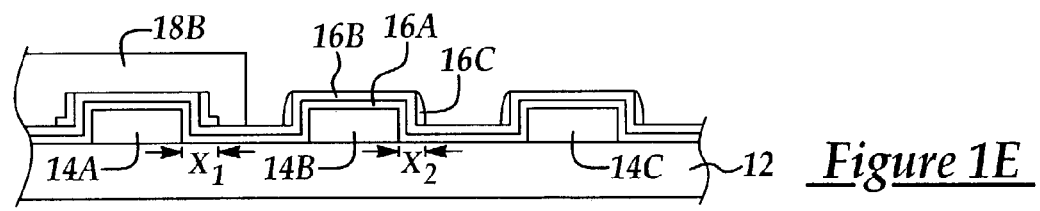

Referring to FIG. 1E, a second protective photoresist layer 18B is patterned to cover the first plurality, e.g., 14A including the first sidewall spacer width and exposing a second plurality e.g., 14B and 14C, followed by an anisotropic etching process to etch through a thickness of the uppermost (third) spacer dielectric layer 16C to expose the second spacer dielectric layer, 16B to form the second sidewall spacer width X2.

Figure 1F:
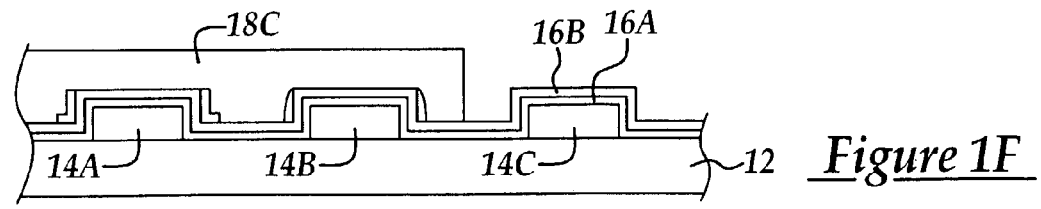

Referring to FIG. 1F, a third protective photoresist layer 18C is then deposited and patterned to include covering the first plurality, e.g., 14A and a portion of the second plurality, e.g., 14B of gate structures to expose a third plurality, e.g., gate structure 14C. A second isotropic etching process is carried out to remove a remaining portion of the third spacer dielectric layer 16C remaining over the second spacer dielectric layer 16B.

Figure 1G:
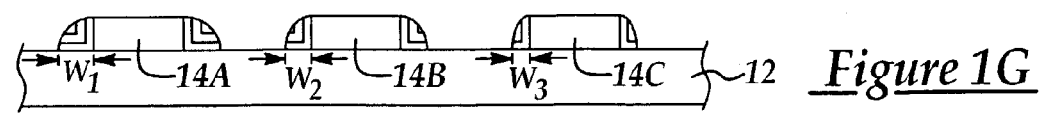

Referring to FIG. 1G, the third protective photoresist layer is removed and a third anisotropic etching process is then carried out to etch through a thickness portion of the remaining spacer dielectric layers, for example the first and second spacer dielectric layers, 16B and 16A, respectively to expose a common substrate level for the first, second, and third plurality of gate structures, for example substrate 12 and to form final sidewall spacer widths e.g., W1, W2, and W3.

Figure 2A:
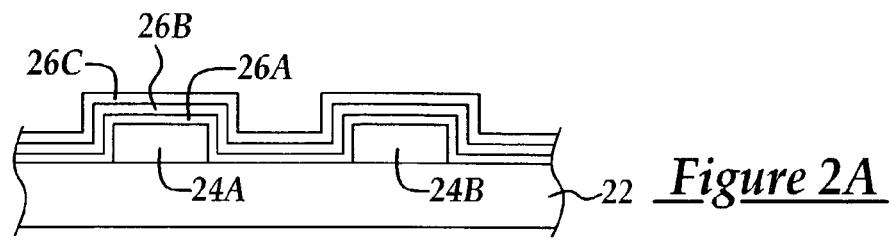
FIGS. 2A–2D are cross sectional side views of a portion of a semiconductor device at manufacturing stages according to an embodiment of the present invention.
Figure 2B:
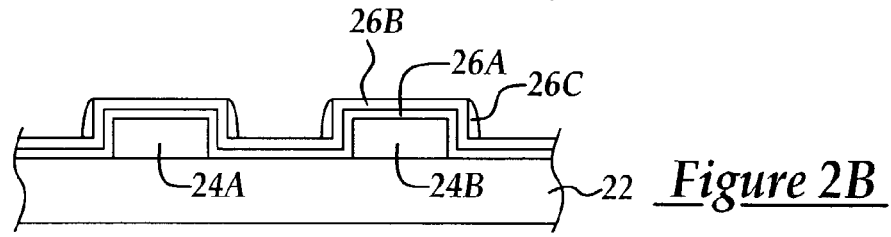

Referring to FIG. 2A, in another embodiment, an exemplary implementation is shown for the formation of an even number of sidewall spacer widths, for example two, with respect to two pluralities of gate structures e.g., 24A and 24B. As shown in FIG. 2A there are N+1 (three) spacer dielectric layers e.g., 26A, 26B, and 26C formed over the gate structures e.g., 24A and 24B for forming N desired spacer widths (two). Referring to FIG. 2B, a first anisotropic etching process is first carried out to etch through a thickness portion of the uppermost spacer dielectric layer, e.g., 26C to form a first plurality of gate structures with a first sidewall spacer width. This embodiment differs from the first embodiment in that the process begins with a first anisotropic etching process over an exposed first plurality of gate structures, e.g., 24A and 24C.

Figure 2C:
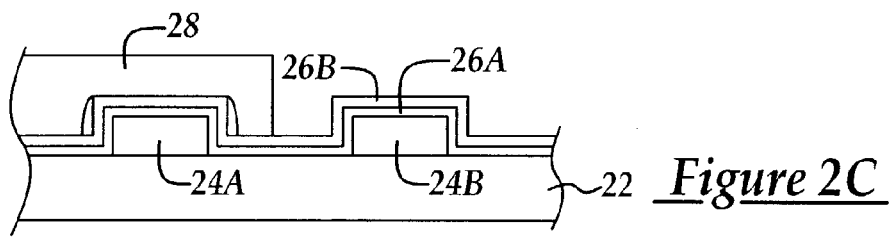

Referring to FIG. 2C, following formation of the first sidewall spacer width, a second plurality of gates structures, a subset of the first plurality, e.g., 24B are selectively exposed by photolithographic patterning first photoresist protective layer 28 which remains covering a remaining portion of the first plurality of gate structures, e.g., 24A. The exposed second plurality, e.g., 24B is subjected to a first isotropic etching process to selectively remove a remaining portion of the uppermost spacer dielectric layer, e.g., 26C overlying spacer dielectric layer 26B.

Figure 2D:
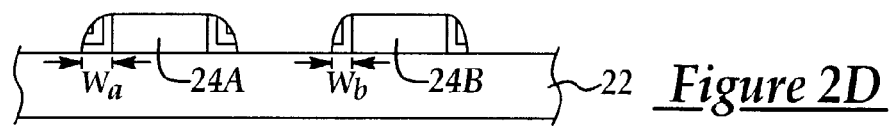

Referring to FIG. 2D, the protective photoresist layer 28 is then removed from the process wafer surface to expose the first plurality of gate structures followed by an anisotropic etching process to etch through a thickness portion of the next two underlying layers, e.g., 26B and 26A, to form two final sidewall spacer widths Wa and Wb, for example exposing substrate 22.

Subsequent processes, including formation of a liner layer over the sidewall spacers may optionally be carried out, for example by an oxide growth method, a spin coating method or a CVD deposition method. Subsequent processes are then preferably carried out such as an ion implantation processes as are known in the art to form doped areas in the substrate 12, for example HDD source/drain regions using the sidewall spacers as an ion implantation mask.

Thus according to the present invention, an improved method has been presented for forming different sidewall spacer widths to form different transistor operating domains in a semiconductor wafer manufacturing process where the number of processing steps required to produce the multiple sidewall spacer widths is reduced, especially etching of substrate areas overlying the source and drain regions adjacent the sidewall spacers thereby avoiding etching damage to the source and drain substrate areas.

Figure 3:
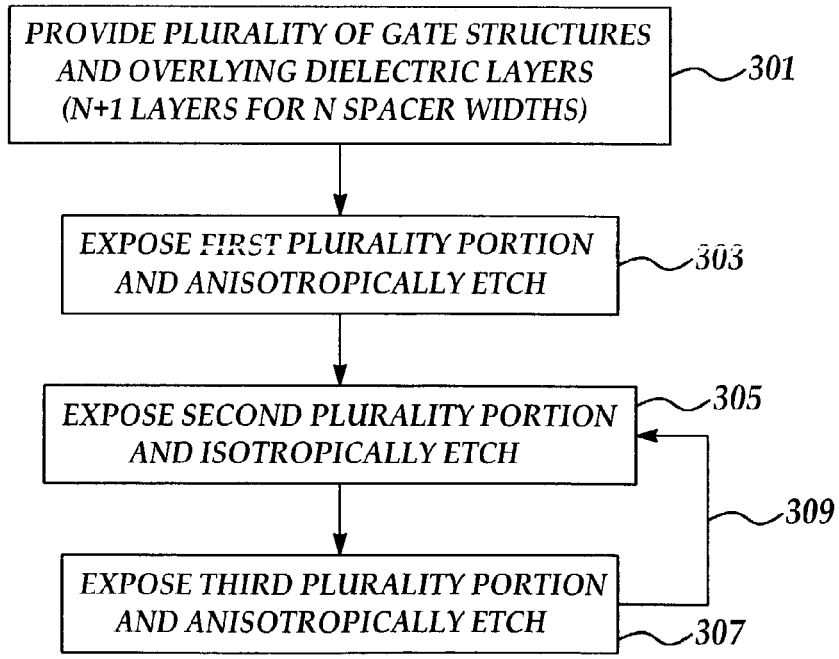
FIG. 3 is a process flow diagram including several embodiments of the present invention.

Referring to FIG. 3 is shown a process flow diagram including several embodiments of the present invention. In process 301, a plurality of gate structures overlying a substrate are provided including at least N overlying spacer dielectric layers to produce N spacer widths where N is greater or equal to 2. In process 303 a first selected portion of the plurality of gate structures are exposed including overlying spacer dielectric layers, for example by a photolithographic patterning process followed by an anisotropic etching process to etch through a thickness of at least one uppermost spacer dielectric layer of the first selected portion of the plurality of gate structures to form a first sidewall spacer width. In process 305, a first subsequent selected portion of the plurality (e.g., second plurality) of gate structures and overlying dielectric layers are exposed followed by an isotropic etching process to remove the uppermost spacer dielectric layer. The first subsequent selected portion may include the first selected portion or be different from the first selected portion. In process 307 a second subsequent selected portion of the plurality of gate structures (e.g., third plurality) is exposed which may include or be different from the first selected portion followed by a subsequent anisotropic etching process etching through a thickness of at least the uppermost spacer dielectric layer. As indicated by process directional arrow 309, processes 305 and 307 may be optionally repeated to form additional sidewall spacer widths.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming pluralities of gate sidewall spacers each plurality comprising different associated gate sidewall spacer widths comprising the steps of:
   providing a plurality of gate structures formed overlying a substrate and comprising at least two dielectric layers formed substantially conformally to cover the gate structures;
   exposing a first selected portion of the plurality according to a first photoresist patterning process;
   then anisotropically etching through a thickness portion comprising at least an uppermost dielectric layer to form a first sidewall spacer width;
   then exposing a first subsequent selected portion of the plurality according to a first subsequent photoresist patterning process;
   then isotropically etching through at least a thickness portion of the uppermost dielectric layer;
   then exposing a second subsequent selected portion of the plurality according to a second subsequent photoresist patterning process; and,
   then anisotropically etching through at least a thickness portion of a dielectric layer underlying the uppermost dielectric layer to form a subsequent sidewall spacer width different from the first sidewall spacer width.

2. The method of claim 1, wherein the steps of exposing a first subsequent selected portion and exposing a second subsequent selected portion are repeated to form more than two spacer widths wherein the at least two dielectric layers comprises more than two dielectric layers.

3. The method of claim 1, wherein the at least two dielectric layers comprise at least N+1 dielectric layers where N is the number of desired differently sized spacer widths associated with a different plurality of gate structures.

4. The method of claim 3, wherein N+1 is at least equal to 3.

5. The method of claim 1, wherein the first subsequent selected portion is a subset of the first selected portion.

6. The method of claim 1, wherein the second subsequent selected portion is a subset of the first selected portion.

7. The method of claim 1, wherein the second subsequent selected portion is different from the first selected portion.

8. The method of claim 1, wherein the at least two dielectric layers are selected from the group consisting of silicon oxide, silicon nitride, silicon oxynitride, silicon carbide, and silicon oxycarbide.

9. The method of claim 1, wherein the at least two dielectric layers are selected such that any adjacent two have an etching rate in an etching process differing by at least a factor of 5.

10. The method of claim 1, wherein each of the at least two dielectric layers is formed having a thickness of from about 100 Angstroms to about 1500 Angstroms.

11. The method of claim 1, wherein the subsequent sidewall spacer width is less than the first sidewall spacer width.

12. The method of claim 1, wherein adjacent dielectric layers comprising the at least two dielectric layers have different etching rates.

13. The method, of claim 1, wherein at least one of the sidewall spacer widths comprises the at least two dielectric layers.

14. A method of forming different sidewall spacer widths, each of said different sidewall spacer widths associated with a separate plurality of gate structures, comprising the steps of:
   providing a plurality of gate structures formed overlying a substrate and comprising at least three dielectric layers covering each of the gate structures;
   exposing at first selected portion of the plurality;
   then anisotropically etching through a thickness portion comprising at least an uppermost dielectric layer to form a first sidewall spacer width;
   then exposing a first subsequent selected portion of the plurality;
   then isotropically etching through at least a thickness portion of a remaining portion of the uppermost dielectric layer;
   then exposing a second subsequent selected portion of the plurality; and,
   then anisotropically etching through at least a thickness portion of a dielectric layer underlying the uppermost dielectric layer to form a subsequent sidewall spacer width different from the first sidewall spacer width.

15. The method of claim 14 wherein the at least three dielectric layers comprise N+1 dielectric layers and the steps of exposing a first subsequent selected portion and exposing a second subsequent selected portion are repeated to form N spacer widths.

16. The method of claim 15, wherein the step of exposing the first selected portion includes anisotropically a etching through a thickness portion comprising two uppermost dielectric layers.

17. The method of claim 15, wherein the steps of exposing a first subsequent selected portion and exposing a second subsequent selected portion are repeated to form three different sidewall spacer widths.

18. The method of claim 17, wherein the first subsequent selected portion is a subset of the first selected portion.

19. The method of claim 14, wherein the at least three dielectric layers are selected from the group consisting of silicon oxide, silicon nitride, silicon oxynitride, silicon carbide, and silicon oxycarbide.

20. The method of claim 14, wherein the at least three dielectric layers are selected such that any two adjacent dielectric layers of the at least three have an etching rate in an etching process differing by at least a factor of 5.

* * * * *